(12) United States Patent
Cameron et al.

(10) Patent No.: US 9,929,014 B2
(45) Date of Patent: Mar. 27, 2018

(54) DOPANT PRECURSORS FOR MONO-LAYER DOPING

(71) Applicant: Entegris, Inc., Billerica, MA (US)

(72) Inventors: Thomas M. Cameron, Newtown, CT (US); Emanuel I. Cooper, Scarsdale, NY (US); Sung Han, Damariscotta, ME (US)

(73) Assignee: Entegris, Inc., Billerica, MA (US)

( * ) Notice: Subject to any disclaimer, the term of this patent is extended or adjusted under 35 U.S.C. 154(b) by 0 days.

(21) Appl. No.: 15/037,940

(22) PCT Filed: Nov. 22, 2014

(86) PCT No.: PCT/US2014/066984
§ 371 (c)(1),
(2) Date: May 19, 2016

(87) PCT Pub. No.: WO2015/080985
PCT Pub. Date: Jun. 4, 2015

(65) Prior Publication Data
US 2016/0276155 A1  Sep. 22, 2016

Related U.S. Application Data

(60) Provisional application No. 61/909,459, filed on Nov. 27, 2013.

(51) Int. Cl.
*H01L 21/22* (2006.01)
*H01L 21/225* (2006.01)
*H01L 21/228* (2006.01)

(52) U.S. Cl.
CPC ........ *H01L 21/2225* (2013.01); *H01L 21/228* (2013.01); *H01L 21/2254* (2013.01)

(58) Field of Classification Search
CPC ............. H01L 21/2225; H01L 21/2254; H01L 21/228
See application file for complete search history.

(56) References Cited

U.S. PATENT DOCUMENTS 7,078,325 B2   7/2006  Curello
8,354,333 B2   1/2013  Afzali-Ardakani
(Continued)

FOREIGN PATENT DOCUMENTS

KR   2012-0110193 A   10/2012

*Primary Examiner* — Michael Jung
*Assistant Examiner* — Charles R Peters

(57) ABSTRACT

A doping process is described, which includes applying to a substrate a film of dopant material that bonds to the substrate by at least one of hydrogen bonding and covalent bonding; encapsulating the film on the substrate with an encapsulant material, and subjecting the encapsulated film to rapid thermal processing to cause dopant from the dopant material to migrate into the substrate. The film of dopant material is applied from a dopant composition selected from among: (i) dopant compositions comprising an aqueous or glycol solution comprising an inorganic dopant compound; (ii) dopant compositions comprising an arsenic, phosphorus, boron, or antimony compound in which ligands or moieties coordinated to an arsenic, phosphorus, boron, or antimony central atom have coordination bond energies that are lower than those associated with coordinating bonds of said central atom to oxygen or carbon; (iii) dopant compositions comprising a coordinated moiety that selectively and covalently bonds to the substrate; (iv) dopant compositions comprising a compound that undergoes hydrolysis and alcoholysis to covalently bond a dopant functionality to the substrate in said film of dopant material; (v) dopant compositions comprising precursor vapor of an organodopant compound; (vi) dopant compositions interactive with a surface functionality of the substrate to bind the dopant composition to the substrate, wherein the substrate comprises a silicon surface (Continued)

comprising said surface functionality; (vii) dopant compositions interactive with the substrate to covalently bond with a pretreated and/or modified silicon surface thereof; and (viii) dopant compositions interactive with the substrate to bond with the substrate on a silicon surface thereof that has been modified by a treatment comprising at least one of: (A) contacting the silicon surface with a chemical solution; (B) exposing the silicon surface to plasma; and (C) exposing the silicon surface to ultraviolet radiation.

18 Claims, 1 Drawing Sheet

(56) References Cited

U.S. PATENT DOCUMENTS

| | | |
|---|---|---|
| 8,586,397 B2 | 11/2013 | Wu |
| 8,691,675 B2 | 4/2014 | Afzali-Ardakani |
| 2008/0314288 A1* | 12/2008 | Biro .................. C30B 31/04 106/287.17 |
| 2012/0252155 A1 | 10/2012 | Choi |
| 2013/0115763 A1* | 5/2013 | Takamure ......... H01L 21/02129 438/513 |
| 2014/0124896 A1* | 5/2014 | Hochstetler ............ C07F 9/706 257/607 |

* cited by examiner

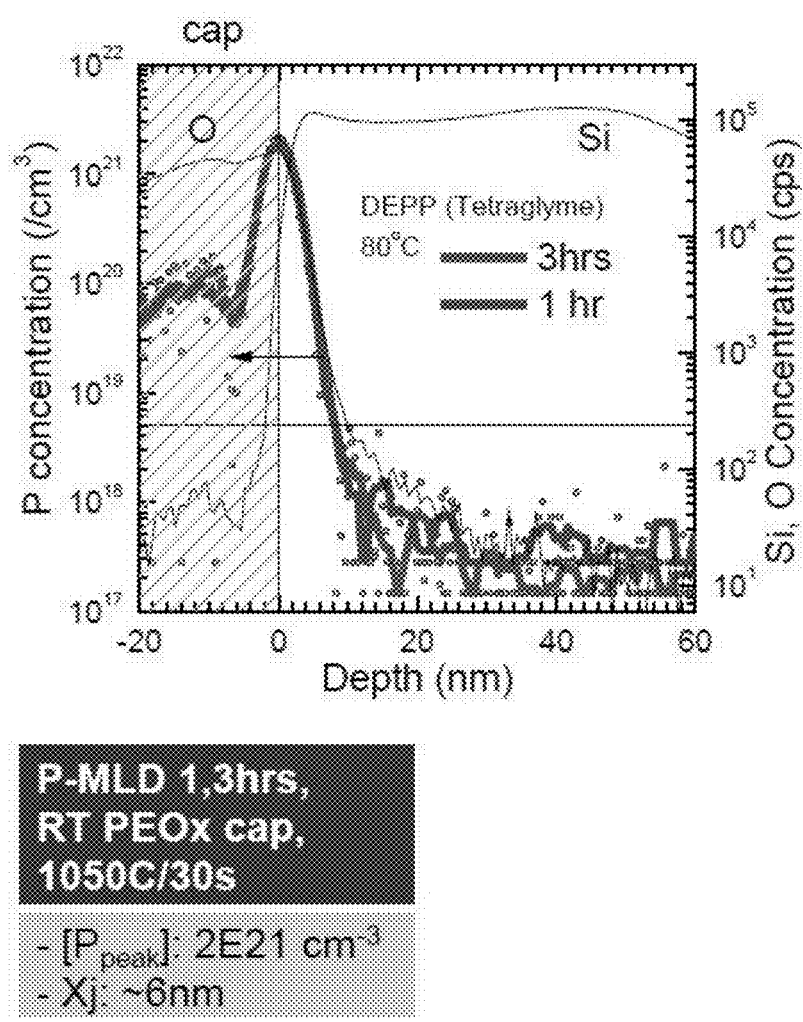

DOPANT PRECURSORS FOR MONO-LAYER DOPING

CROSS-REFERENCE TO RELATED APPLICATIONS

This application is a U.S. national phase under the provisions of 35 U.S.C. § 371 of International Patent Application No. PCT/US14/66984 filed Nov. 22, 2014, which in turn claims priority of U.S. Provisional Patent Application No. 61/909,459 filed Nov. 27, 2013. The disclosures of such international patent application and US priority patent application are hereby incorporated herein by reference in their respective entireties, for all purposes.

FIELD

The present disclosure relates to monolayer doping (MLD) compositions and processes, and semiconductor products manufactured using such compositions and processes.

DESCRIPTION OF THE RELATED ART

Monolayer doping has been proposed as a technique for forming ultra-shallow junctions in the manufacture of semiconductor products such as FinFET devices and non-planar integrated circuits.

Doping in the semiconductor space currently is dominated by ion implantation techniques. Ion implantation provides a number of process advantages that have contributed to its success, but it also has some shortcomings that render it less than optimal as a unit operation in semiconductor manufacturing. Ion implantation frequently damages the substrate to an extent rendering the substrate unusable or in need of reworking. In addition, ion implantation, while well-suited for planar or low aspect ratio structures, but faces obstacles in application to emerging three-dimensional structures due to the associated difficulties in achieving uniform incorporation of dopant in such substrate geometries. Plasma immersion has developed as a competing technology, but it likewise faces issues of non-uniform dopant incorporation in many instances and in specific to 3D device structures.

Monolayer doping is a technique that may be useful in overcoming the deficiencies mentioned above that are associated with ion implantation and plasma immersion processes. MLD involves treating a substrate surface, e.g., of a hydrogen-terminated silicon substrate, with a solution of a dissolved dopant species, such as a boron- or a phosphorus- or an arsenic-containing compound. Ideally, the dopant forms a monolayer on the substrate surface and remains intact after the bulk solution is rinsed from the wafer surface. The dopant species then is encapsulated on the substrate surface by known methods for depositing silicon dioxide ($SiO_2$), such as e-beam evaporation or other low temperature processes. This $SiO_2$ deposition step is followed by rapid thermal processing (RTP) and/or flash annealing (FA) to provide a spike annealing operation that is effective to drive the dopant species into the substrate.

MLD, while conceptually affording a relatively simple wet processing technique for doping, and attractive as a potential alternative to ion implantation for sub-5 nm junction applications at the ~16 nm node, nonetheless has certain disadvantages. Since the solutions employed for MLD processing are relatively dilute in character, MLD techniques may entail large amounts of solvent waste. In addition, if toxic materials such as arsenic dopant compounds are employed, MLD substrate application techniques such as spin and/or dip coating may require redesign of existing equipment to mitigate human exposure.

The goal of MLD is to achieve ultra-shallow junctions that are doped at useful dopant levels. Although the goal is to drive the dopant into the substrate, the dopant typically diffuses both into the $SiO_2$ encapsulation layer and into the substrate during annealing processing.

In MLD doping with Group V compounds, diethyl propyl phosphonate (DEPP) is a conceptually useful phosphorus dopant precursor compound that can interact with the substrate surface by hydrogen bonding and thus not be robustly bound to the substrate. Arsenic compounds proposed for MLD processes include those that contain As—C bonds (e.g., triphenylarsine) and esters of As(III) or As(V) acids (e.g., triethyl arsenate (TEASO)) that contain As—O bonds. The former usually require use of high decomposition temperatures and—due to their limited water solubility—high boiling organic solvents. The latter are water-sensitive and therefore require thoroughly dried solvents and processing under non-oxidizing ambient conditions.

As a general consideration, the dopant molecule utilized in the MLD process must enable sufficient homogeneity of the doped film to be achieved, and possess sufficient affinity for the substrate surface, so that uniform dopant coverage and stability during process steps can be reliably and reproducibly obtained.

Dopant uniformity and minimization of random dopant fluctuations are therefore required, but these objectives are difficult to realize with the phosphorus and arsenic dopant compounds that have been contemplated to date.

SUMMARY

The present disclosure relates to monolayer doping (MLD) compositions and processes, and semiconductor products manufactured using such compositions and processes.

In one aspect, the disclosure relates to a doping process, comprising: applying to a substrate a film of dopant material that bonds to the substrate by at least one of hydrogen bonding and covalent bonding; encapsulating the film on the substrate with an encapsulant material, and subjecting the encapsulated film to rapid thermal processing to cause dopant from the dopant material to migrate into the substrate, wherein the film of dopant material is applied from a dopant composition selected from the group consisting of:
(i) dopant compositions comprising an aqueous or glycol solution comprising an inorganic dopant compound;
(ii) dopant compositions comprising an arsenic, phosphorus, boron, or antimony compound in which ligands or moieties coordinated to an arsenic, phosphorus, boron, or antimony central atom have coordination bond energies that are lower than those associated with coordinating bonds of said central atom to oxygen or carbon;
(iii) dopant compositions comprising a coordinated moiety that selectively and covalently bonds to the substrate;
(iv) dopant compositions comprising a compound that undergoes hydrolysis and alcoholysis to covalently bond a dopant functionality to the substrate in said film of dopant material;
(v) dopant compositions comprising precursor vapor of an organodopant compound;
(vi) dopant compositions interactive with a surface functionality of the substrate to bind the dopant composition to the substrate, wherein the substrate comprises a silicon surface comprising said surface functionality;

(vii) dopant compositions interactive with the substrate to covalently bond with a pretreated and/or modified silicon surface thereof; and (viii) dopant compositions interactive with the substrate to bond with the substrate on a silicon surface thereof that has been modified by a treatment comprising at least one of: (A) contacting the silicon surface with a chemical solution; (B) exposing the silicon surface to plasma; and (C) exposing the silicon surface to ultraviolet radiation.

Other aspects, features and embodiments of the disclosure will be more fully apparent from the ensuing description and appended claims.

BRIEF DESCRIPTION OF THE DRAWINGS

FIG. 1 is a secondary ion mass spectrometry (SIMS) depth profile of an annealed phosphorus monolayer doping (P-MLD) sample generated using DEPP as a phosphorus dopant compound, showing phosphorus concentration (atoms per cubic centimeter) and silicon and oxygen concentration (measured in arbitrary counts per second (CPS) units), as a function of depth, with the $SiO_2$ cap profile being shown at depth of −20 nm to 0 nm, and the silicon substrate profile being shown at depth of from 0 nm to 60, and with the phosphorus dopant concentration being shown for monolayer doping durations of one and three hours, and annealing carried out at 1050° C. for 30 seconds.

DETAILED DESCRIPTION

The present disclosure relates to monolayer doping (MLD) compositions and processes, and semiconductor products manufactured using such compositions and processes.

As used herein and in the appended claims, the singular forms "a", "and", and "the" include plural referents unless the context clearly dictates otherwise.

As used herein, the term "film" refers to a layer of deposited material having a thickness below 1000 micrometers, e.g., from such value down to atomic monolayer thickness values. In various embodiments, film thicknesses of deposited material layers in the practice of the invention may for example be below 100, 10, or 1 micrometers, or in various thin film regimes below 200, 100, or 50 nanometers, depending on the specific application involved. As used herein, the term "thin film" means a layer of a material having a thickness below 1 micrometer.

As used herein, the term "monolayer" in application to monolayer doping compositions and processes refers to doping compositions and processes that produce films of deposited dopant material having a thickness that is approximately single molecule thickness. As used herein, the terms "rapid thermal processing" or "RTP," and "flash annealing" or "FA," refer to exposing a substrate bearing a dopant film thereon to high temperature of at least 600° C. on a timescale of less than one minute so that dopant from the dopant film migrates into the substrate.

As used herein, the term "organodopant compound" refers to a compound comprising the dopant element coordinated to one or more organo moieties.

"Organo moieties" as referred to herein may be of any suitable type, and may for example comprise alkyl, aryl, cycloalkyl, or other organo moieties.

As used herein, the term "alkyl" includes, but is not limited to, methyl, ethyl, propyl, isopropyl, butyl, s-butyl, t-butyl, pentyl and isopentyl and the like. In various embodiments, alkyl moieties may include $C_1$-$C_{12}$ alkyl. "Aryls" as used herein includes hydrocarbons derived from benzene or a benzene derivative that are unsaturated aromatic carbocyclic groups of from 6 to 10 carbon atoms. The aryls may have a single or multiple rings. The term "aryl" as used herein also includes substituted aryls. Examples include, but are not limited to phenyl, naphthyl, xylene, phenylethane, substituted phenyl, substituted naphthyl, substituted xylene, substituted phenylethane and the like. "Cycloalkyls" as used herein include, but are not limited to cyclopropyl, cyclobutyl, cyclopentyl, cyclohexyl and the like.

In all chemical formulae herein, a range of carbon numbers will be regarded as specifying a sequence of consecutive alternative carbon-containing moieties, including all moieties containing numbers of carbon atoms intermediate the endpoint values of carbon number in the specific range as well as moieties containing numbers of carbon atoms equal to an endpoint value of the specific range, e.g., $C_1$-$C_6$, is inclusive of $C_1$, $C_2$, $C_3$, $C_4$, $C_5$ and $C_6$, and each of such broader ranges may be further limitingly specified with reference to carbon numbers within such ranges, as subranges thereof. Thus, for example, the range $C_1$-$C_6$ would be inclusive of and can be further limited by specification of sub-ranges such as $C_1$-$C_3$, $C_1$-$C_4$, $C_2$-$C_6$, $C_4$-$C_6$, etc. within the scope of the broader range.

Thus, the identification of a carbon number range, e.g., in $C_1$-$C_{12}$ alkyl, is intended to include each of the component carbon number moieties within such range, so that each intervening carbon number and any other stated or intervening carbon number value in that stated range, is encompassed, it being further understood that sub-ranges of carbon number within specified carbon number ranges may independently be included in smaller carbon number ranges, within the scope of the disclosure, and that ranges of carbon numbers specifically excluding a carbon number or numbers are included in the invention, and sub-ranges excluding either or both of carbon number limits of specified ranges are also included in the disclosure. Accordingly, $C_1$-$C_{12}$ alkyl is intended to include methyl, ethyl, propyl, butyl, pentyl, hexyl, heptyl, octyl, nonyl, decyl, undecyl and dodecyl, including straight chain as well as branched groups of such types. It therefore is to be appreciated that identification of a carbon number range, e.g., $C_1$-$C_{12}$, as broadly applicable to a substituent moiety, enables, in specific embodiments of the invention, the carbon number range to be further restricted, as a sub-group of moieties having a carbon number range within the broader specification of the substituent moiety. By way of example, the carbon number range e.g., $C_1$-$C_{12}$ alkyl, may be more restrictively specified, in particular embodiments of the disclosure, to encompass sub-ranges such as $C_1$-$C_4$ alkyl, $C_2$-$C_8$ alkyl, $C_2$-$C_4$ alkyl, $C_3$-$C_5$ alkyl, or any other sub-range within the broad carbon number range. In other words, a carbon number range is deemed to affirmatively set forth each of the carbon number species in the range, as to the substituent, moiety, or compound to which such range applies, as a selection group from which specific ones of the members of the selection group may be selected, either as a sequential carbon number sub-range, or as specific carbon number species within such selection group.

The same construction and selection flexibility is applicable to stoichiometric coefficients and numerical values specifying the number of atoms, functional groups, ions or moieties, as to specified ranges, numerical value constraints (e.g., inequalities, greater than, less than constraints), as well as oxidation states and other variables determinative of the specific form, charge state, and composition applicable to dopant sources, implantation species, and chemical entities within the broad scope of the present disclosure.

The disclosure, as variously set out herein in respect of features, aspects and embodiments thereof, may in particular implementations be constituted as comprising, consisting, or consisting essentially of, some or all of such features, aspects and embodiments, as well as elements and components thereof being aggregated to constitute various further implementations of the disclosure. The disclosure is set out herein in various embodiments, and with reference to various features and aspects of the disclosure. The disclosure contemplates such features, aspects and embodiments in various permutations and combinations, as being within the scope of the invention. The disclosure may therefore be specified as comprising, consisting or consisting essentially of, any of such combinations and permutations of these specific features, aspects and embodiments, or a selected one or ones thereof.

The present disclosure broadly contemplates a doping process, comprising: applying to a substrate a film of dopant material that bonds to the substrate by at least one of hydrogen bonding and covalent bonding; encapsulating the film on the substrate with an encapsulant material, and subjecting the encapsulated film to rapid thermal processing to cause dopant from the dopant material to migrate into the substrate, wherein the film of dopant material is applied from a dopant composition selected from the group consisting of:
(i) dopant compositions comprising an aqueous or glycol solution comprising an inorganic dopant compound;
(ii) dopant compositions comprising an arsenic, phosphorus, boron, or antimony compound in which ligands or moieties coordinated to an arsenic, phosphorus, boron, or antimony central atom have coordination bond energies that are lower than those associated with coordinating bonds of said central atom to oxygen or carbon;
(iii) dopant compositions comprising a coordinated moiety that selectively and covalently bonds to the substrate;
(iv) dopant compositions comprising a compound that undergoes hydrolysis and alcoholysis to covalently bond a dopant functionality to the substrate in said film of dopant material;
(v) dopant compositions comprising precursor vapor of an organodopant compound;
(vi) dopant compositions interactive with a surface functionality of the substrate to bind the dopant composition to the substrate, wherein the substrate comprises a silicon surface comprising such surface functionality, e.g., specific surface functionality, such as —OH, —NH or acidic group (—COOH) functionality, to enable the monolayer dopant to be bound to the silicon surface uniformly over the 3D structure;
(vii) dopant compositions interactive with the substrate to covalently bond with a pretreated and/or modified silicon surface thereof, e.g., precursor formulations that are specifically chosen to optimize covalent bond formation with a specific pre-treated and/or modified silicon surface; and
(viii) dopant compositions interactive with the substrate to bond with the substrate on a silicon surface thereof that has been modified by a treatment comprising at least one of: (A) contacting the silicon surface with a chemical solution; (B) exposing the silicon surface to plasma; and (C) exposing the silicon surface to ultraviolet radiation, so that such contact with a chemical solution, plasma pre-treatment, or UV photolysis pre-treatment is effective to prepare the surface for monolayer formation and dopant bonding.

The substrate utilized in such process may be of any suitable type, and may for example comprise a silicon substrate, a SiGe substrate, a germanium substrate or a germanium tin substrate. The substrate in specific implementations can comprise a hydrogen-terminated silicon substrate.

The film in the foregoing process of the disclosure may comprise a monolayer film. The film of dopant material may be applied by wet, dry, or vapor techniques. The film may be rinsed on the substrate before the film is encapsulated.

Encapsulation of the film on the substrate with the encapsulant material may be carried out in any suitable manner, and may for example comprise deposition of silicon dioxide ($SiO_2$) on the film to effect encapsulation. Such deposition may be carried out by any suitable technique, e.g., e-beam evaporation, atomic layer deposition, low temperature chemical vapor deposition, or the like.

The film of dopant material itself may be applied from a dopant composition comprising a phosphorus dopant compound, a boron dopant compound, an arsenic dopant compound, an antimony dopant compound, or other appropriate dopant compound. For example, the dopant composition may comprise an arsenic dopant compound that undergoes exchange reaction in contact with silicon, SiGe, or germanium surfaces.

In various embodiments, the film of dopant material is applied from a dopant composition comprising an aqueous solution comprising an inorganic arsenic compound, e.g., $As_2O_3$.

In other embodiments, the film of dopant material may be applied from a dopant composition comprising an arsenic, phosphorus, boron, or antimony compound in which ligands or moieties coordinated to an arsenic, phosphorus, boron, or antimony central atom have coordination bond energies that are lower than those of coordinating bonds of said central atom to oxygen or carbon.

The film of dopant material in other embodiments may be applied from a dopant composition comprising a coordinated moiety that selectively and covalently bonds to the substrate. For example, the dopant composition may comprise a dopant compound comprising alkynyl or alkenyl functionality as the coordinated moiety. The dopant compound may comprise a suitable dopant species such as phosphorus or arsenic, or other dopant element.

Illustrative dopant compounds include compound selected from the group consisting of:

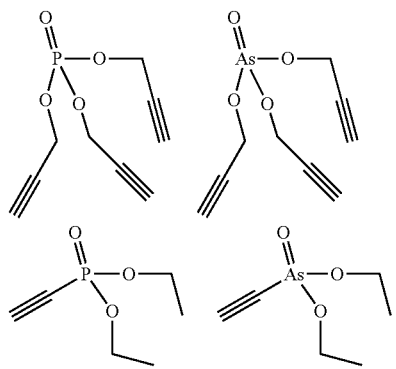

-continued

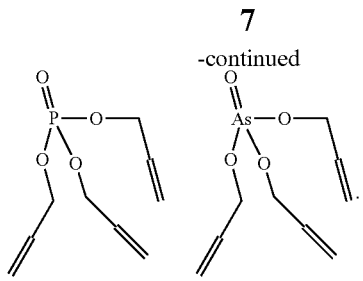

Other illustrative dopant compounds include compounds selected from the group consisting of:

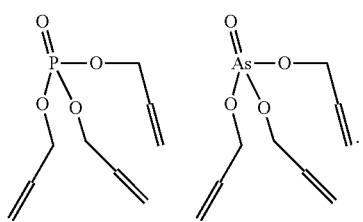

and the doping process comprises activating the dopant compound by at least one of heat activation and light activation.

The dopant composition utilized in the doping process may comprise a dopant compound comprising allyl functionality.

The dopant composition in various embodiments comprises a dopant compound selected from the group consisting of:

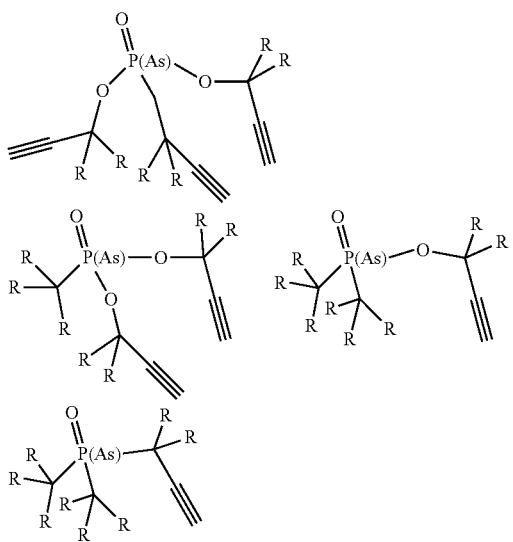

wherein P(As) is phosphorus or arsenic, and R is an organo moiety.

The dopant composition in other embodiments may comprise a dopant compound selected from the group consisting of phosphonic acid compounds and their arsine analogs. In a specific embodiment, the dopant composition comprises dodecylphosphonic acid.

The doping process of the disclosure may be conducted with the film of dopant material being applied from a dopant composition comprising a compound that undergoes hydrolysis, and alcoholysis or aminolysis, to covalently bond a dopant functionality to the substrate in the film of dopant material. The compound may comprise triethyl arsenate, triethyl phosphate, or triethyl borate, and the process may be conducted so that such compound undergoes hydrolysis and alcoholysis (or aminolysis) in a reaction scheme comprising the reaction:

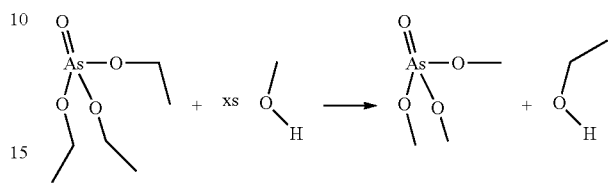

wherein XS is a stoichiometric excess. This reaction may be carried out under any suitable reaction conditions, e.g., a reaction time of less than 1 minute at room temperature.

The doping process of the present disclosure may be carried out with a substrate that is functionalized with hydroxyl (silanol) and amino functionality.

In various embodiments, the doping process of the present disclosure can be carried out as comprising the following reaction sequence, wherein the substrate comprises a silicon substrate having a hydrogen-terminated surface:

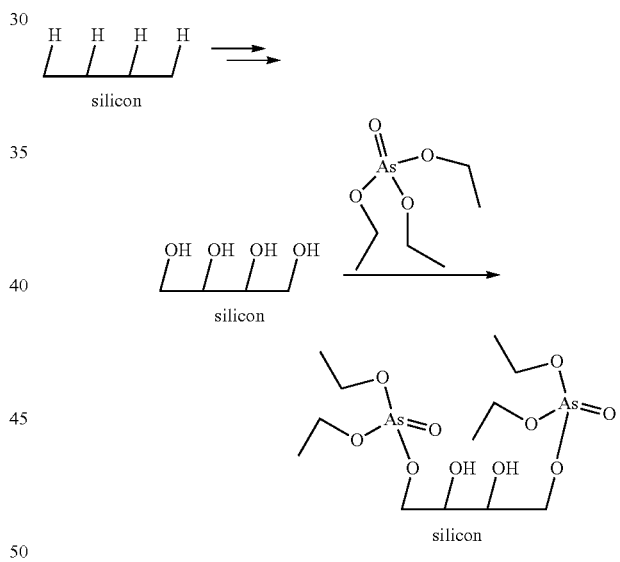

The doping process of the present disclosure in various embodiments can be carried out with the film of dopant material being applied to the substrate from a liquid solution of dopant precursor.

In other embodiments, the doping process can be carried out with application of the film of dopant material to the substrate from a dopant precursor vapor.

The encapsulant material utilized in the doping process of the present disclosure can be of any suitable type, and may for example comprise $SiO_2$.

In various embodiments, the encapsulant material may be doped with the dopant during encapsulation of the film of dopant material on the substrate, e.g., in chemical vapor deposition, atomic layer deposition, or other vapor deposition of the encapsulant material. The encapsulant material may for example be doped with phosphorus from a dopant precursor comprising triethyl phosphate, or doped with arsenic from a dopant precursor comprising triethyl arsenate, or be doped with another dopant that is present in the previously applied film of dopant material on the substrate.

The encapsulant material may be applied to encapsulate the film on the substrate in any suitable manner. In one embodiment, the encapsulant material is applied from an encapsulant precursor comprising tetraethylorthosilicate.

The doping process of the disclosure may be carried out with any suitable treatment or pretreatment of the substrate. In one embodiment, the substrate is treated with dilute hydrogen fluoride solution prior to application of the film of dopant material, so that the substrate is hydride-terminated.

In one embodiment of the doping process of the present disclosure, the film of dopant material is formed by surface reduction of As(III) from the aqueous solution.

In another embodiment of the doping process, wherein the film of dopant material is applied from a dopant composition comprising an aqueous solution of $As_2O_3$, the $As_2O_3$ may be reduced to elemental arsenic in the aqueous solution, e.g., as mediated by hypophosphoric acid or $SnCl_2$, or the $As_2O_3$ may be reduced to arsine in the aqueous solution, e.g., as mediated by hydrogen, such as may be formed by reaction of zinc and HCl.

In a still further embodiment of the doping process, wherein the film of dopant material is applied from a dopant composition comprising an aqueous solution of $As_2O_3$, the film of dopant material applied to the substrate may comprise at least a partial molecular layer of arsenic formed by chemical reaction comprising the following reaction:

$$3(\equiv Si-H) + As(OH)_3 \rightarrow (\equiv Si)_3As + 3H_2O.$$

In another embodiment of the doping process, wherein the film of dopant material is applied from a dopant composition comprising an organic solution of O=As(OR)3, the film of dopant material applied to the substrate may comprise at least a partial molecular layer of arsenic formed by chemical reaction comprising the following reaction:

$$3(\equiv Si-OH) + O=As(OR)_3 \rightarrow (\equiv Si-O)_3As=O + 3ROH.$$

In yet another embodiment of the doping process, wherein the film of dopant material is applied from a dopant composition comprising an organic solution of O=As(OR)3, the film of dopant material applied to the substrate may comprise at least a partial molecular layer of arsenic formed by chemical reaction comprising the following reaction:

$$3(\equiv Si-NH) + O=As(OR)_3 \rightarrow (\equiv Si-N)_3As=O + 3ROH.$$

In such processes, the chemical reaction may also comprise direct electron exchange with the substrate.

Further, the reaction of the dopant species with the pre-treated silicon surface can be conducted to effect partial decomposition and covalent bonding of the dopant material to the silicon surface.

Similar reaction processes are contemplated for P, B and Sb dopants upon interaction with the modified silicon surfaces, as discussed above. Other variations will be obvious to those skilled in the art, utilizing suitable surface pretreatments and reactive precursor interactions.

In other embodiments, the aqueous solution of the dopant compound may also comprise a fluoride additive such as hydrogen fluoride or hexafluorosilicic acid.

When the doping process utilizes an aqueous solution of the dopant compound, the substrate being doped may be of any suitable type, and in specific embodiments may comprise germanium or silicon, or SiGe.

The film of dopant material may be applied in the doping process from a dopant composition comprising a glycol solution comprising an inorganic arsenic compound, e.g., wherein the glycol solution comprises at least one of ethylene glycol, propylene glycol, and glycerol.

The film of dopant material may be applied in the doping process, in other embodiments, from a dopant composition comprising an aqueous solution comprising an inorganic phosphorus compound, such as $H_3PO_3$ or $H_3PO_2$, or an aqueous solution comprising an inorganic antimony compound, such as $SbCl_3$.

The doping process of the present disclosure in other implementations may utilize a dopant composition comprising arsenic iodide, phosphorus iodide, or antimony iodide. The substrate in such process may be of any suitable type, and may for example comprise Si, Ge, or SiGe. In specific embodiments, in which the dopant composition comprises arsenic iodide, phosphorus iodide, or antimony iodide, the dopant composition may comprise a non-polar aprotic organic solution of the arsenic iodide, phosphorus iodide, or antimony iodide.

When the doping process is carried out with an iodide doping compound, the substrate may be treated with a mild Lewis base prior to application of the film of dopant material, so that the substrate is hydride-terminated. The mild Lewis base may be selected as a reagent that does not covalently bond to arsenic iodide, phosphorus iodide, or antimony iodide, in exposure thereto. The mild Lewis base may be of any suitable type and may for example comprise an ether group. In one embodiment, the mild Lewis base comprises an ether-terminated alkyl silane, and prior to treatment of the substrate with the mild Lewis base, the substrate is treated for partial oxidation thereof.

In other implementations of the doping process of the present disclosure, the dopant composition comprises precursor vapor of an organodopant compound. The organodopant compound may be of any suitable type, and may for example comprise an arsenic compound selected from the group consisting of $As(Et)_3$, $As(Me)_3$, and $As(NMe_2)_3$, wherein Et is ethyl and Me is methyl. The film of dopant material may be applied to the substrate from the precursor vapor of the organodopant by atomic layer deposition, chemical vapor deposition, for other vapor deposition process.

It will be appreciated from the foregoing that the doping process of the present disclosure can be carried out in a wide variety of implementations, and corresponding variation of dopant compositions.

Particular embodiments of the disclosure are more fully elaborated in the ensuing discussion.

In various embodiments, the present disclosure contemplates dopant compositions that will readily react with a H-terminated silicon surface at room temperature in MLD processes. The dopant compositions include phosphorus (P), arsenic (As), boron (B) or antimony (Sb) based materials, as herein more fully described.

In various embodiments, the disclosure relates to arsenic dopant compositions that comprise aqueous solutions of inorganic arsenic compounds, such as for example $As_2O_3$, and undergo exchange reactions with silicon, SiGe, or germanium surfaces. Such aqueous-based compositions avoid the need for high decomposition temperatures and high boiling organic solvents, or alternatively the requirement of ultra-dry solvents and processing under non-oxidizing ambient conditions.

Further embodiments of the disclosure relates to dopant compositions comprising compounds of arsenic, phosphorus, or antimony in which the ligands or moieties coordinated to the As, P, or Sb central atom have coordination bond energies that are lower than those associated with coordinating bonds of these central atoms to oxygen or carbon.

Additional embodiments of the disclosure relate to MLD dopant compositions comprising coordinated moieties that selectively and covalently bond to silicon and other functionalized surfaces in MLD processes, e.g., phosphorus and arsenic compounds that are functionalized with a 1-alkyne moiety or a 1-alkene moiety that will selectively and covalently bond to H-terminated silicon surfaces in MLD processes.

The resulting MLD films will be more homogeneous than those made from compounds that engage in hydrogen bonding with the substrate surface. In addition, the covalently bound molecules will not be easily displaced from the film surface during subsequent process steps.

Illustrative phosphorus and arsenic alkyne compounds capable of covalently bonding to H-terminated silicon surfaces include the following phosphate and arsenate alkyne compounds:

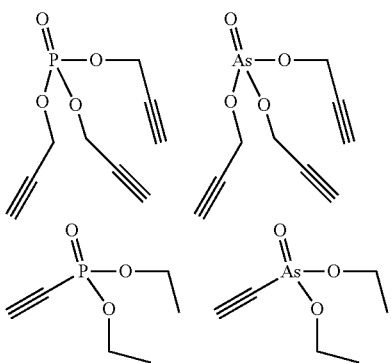

Illustrative phosphorus and arsenic alkene compounds capable of covalently bonding to H-terminated silicon surfaces include the following phosphate and arsenate alkene compounds:

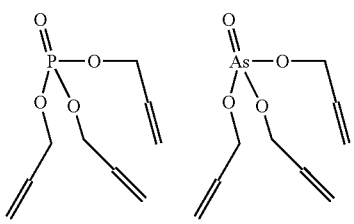

The alkenyl dopant compounds may be usefully employed in applications where the MLD process can accommodate the heat and/or light activation that is required for their use, in contrast to alkynyl dopant compounds that do not require heat and/or light activation.

It will be appreciated that the foregoing phosphate and arsenate alkynyl dopant compounds incorporating propargyl functionality and the foregoing phosphate and arsenate alkenyl dopant compounds incorporating allyl functionality are of an illustrative character, and that any suitable dopant compounds containing ethylenically unsaturated or acetylenically unsaturated functionalities that form covalent bonds with the specific substrate surface utilized in the MLD process may be advantageously employed. For example, the acetylenically unsaturated phosphorus or arsenic dopant compounds may be selected from among the following group of compounds, wherein the designation "P(As)" denotes that the dopant central atom may be either phosphorus or arsenic, and R is an organo moiety:

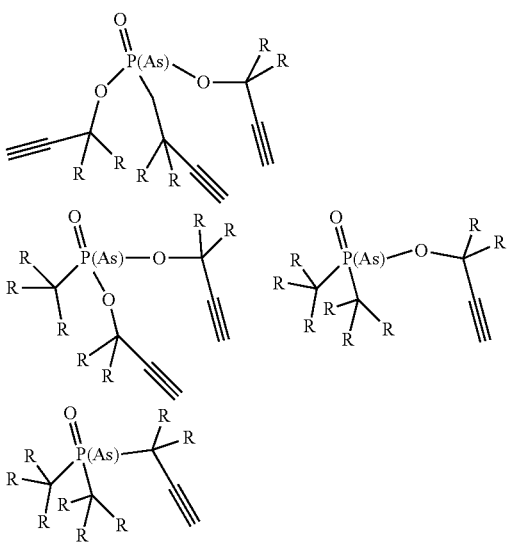

Compounds of the foregoing types can be employed to obtain true monolayer coverage in the MLD process in order to enhance carrier concentration after annealing.

The disclosure contemplates the use of phosphonic acid compounds and their arsine analogs for use in MLD processes. For example, dodecylphosphonic acid (DDPA) can be employed as a phosphorus dopant compound to achieve high levels of surface bound phosphorus. Table 1 below shows the difference in surface bound P between diethyl propyl phosphonate (DEPP) and DDPA as measured by x-ray fluorescence (XRF), with the MLD film formed using DDPA showing ~2.5 times higher concentration of surface bound phosphorus than the corresponding MLD film formed using DEPP.

TABLE 1

Surface bound phosphorus in MLD processes using DEPP and DDPA dopant compounds

| Precursor | Background (kcps) | Peak (kcps) | P (ng/cm$^2$) | P (atoms/cm$^2$) |
|---|---|---|---|---|
| DEPP | 0.58146 | 0.68191 | 3.5 | 6.77E+13 |
| DDPA | 0.61819 | 0.76468 | 8.9 | 1.72E+14 |

Considering solubility aspects of the MLD process as applied to silicon substrates, arsenic dopant compounds have the beneficial characteristic that arsenic is relatively more soluble in silicon than phosphorus or some other dopant elements.

In one aspect of the present disclosure, dopant compounds such as triethyl arsenate (TEASO) are employed, which comprise ligands that undergo hydrolysis and alcoholysis to covalently bond the As or other dopant functionality to the substrate surface before film processing. An illustrative ligand exchange/alcoholysis reaction of TEASO and methanol is as follows:

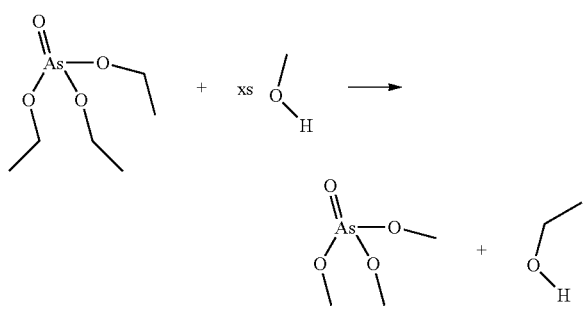

wherein "XS" denotes the fact that the methanol reactant is in stoichiometric excess. This reaction is rapid (<1 minute) in solution at room temperature (~25° C.).

The foregoing reaction may be utilized in an MLD process in which an H-terminated silicon surface is generated or otherwise supplied in the first instance, and a monolayer coverage of silanol (Si—O—H) functionality then is provided on such surface. Reaction of the silanol surface with a dopant compound such as TEASO will result in ligand exchange and covalent attachment of the As moiety to the silicon substrate as shown in the reaction scheme set out below:

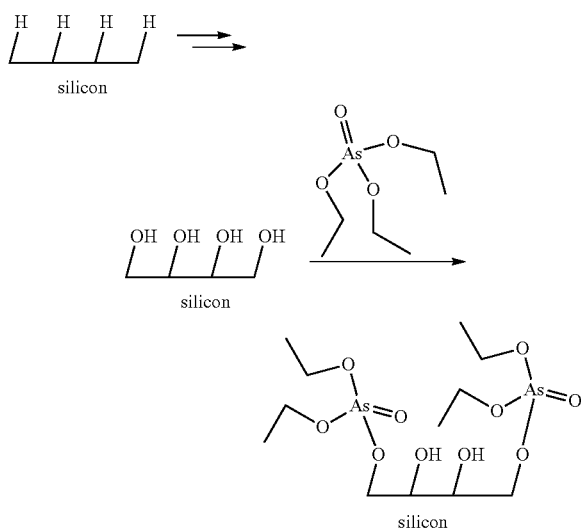

The MLD process used to effect this transformation could be a wet process in which the silicon substrate is exposed to a solution of the dopant precursor or it could comprise a dry process utilizing deposition/thin film growth type equipment.

Another aspect of the present disclosure relates to an MLD process comprising a directionalized doping technique for achieving enhanced dopant concentrations in the substrate.

As previously discussed, the objective of the MLD process is to achieve ultra-shallow junctions that are doped at useful levels. In a typical MLD process, the dopant diffuses both into the cap layer, e.g., of $SiO_2$, and into the substrate during annealing. Such diffusional character is shown in FIG. 1, which is a secondary ion mass spectrometry (SIMS) depth profile of an annealed phosphorus monolayer doping (P-MLD) sample generated using DEPP as a phosphorus dopant compound. The graph shows phosphorus concentration (atoms per cubic centimeter) and silicon and oxygen concentration (measured in arbitrary counts per second (CPS) units), as a function of depth, with the $SiO_2$ cap profile being shown at depth of −20 nm to 0 nm, and the silicon substrate profile being shown at depth of from 0 nm to 60 nm. The phosphorus dopant concentration is shown for monolayer doping durations of one and three hours, with annealing being carried out at 1050° C. for 30 seconds.

The directionalized doping technique of the present disclosure utilizes a doped $SiO_2$ capping layer to enhance the concentration of dopant that diffuses into the substrate on spike annealing. Increasing the concentration of dopant in the cap is utilized to force migration of the dopant into the Si substrate to yield a higher dopant concentration in the substrate than is possible in the absence of such doped capping layer. Chemical vapor deposition (CVD) techniques may be advantageously employed for doping of the capping layer. For example, a doped phosphorus or arsenic capping layer can be easily deposited using triethyl phosphate (TEPO) or triethyl arsenate (TEASO) precursors in CVD mode. The CVD process can for example be arranged to utilize either a cocktail of TEPO or TEASO/TEOS (tetraethylorthosilicate) in forming the capping layer. Alternatively, a dual delivery system can be employed that can deliver TEPO or TEASO from one supply vessel, e.g., ampoule, and tetraethylorthosilicate (TEOS) from a second supply vessel.

In another aspect, the disclosure relates to MLD processes for doping arsenic on silicon or germanium substrates, utilizing surface reduction of As(III) in aqueous solution. This surface reduction process may utilize an arsenic dopant compound such as arsenic trioxide ($As_2O_3$), which is moderately soluble in water (~2% or ~0.1M) and more soluble in bases and in strong acids. Depending on the strength of the reducing agent, the arsenic trioxide can be reduced in aqueous solutions to elemental arsenic (e.g., by hypophosphoric acid or $SnCl_2$) or to arsine (by "nascent" hydrogen, e.g., as formed by reaction of Zn and HCl).

In contact with a Si (or Ge) surface that is hydride-terminated by pretreatment with dilute HF, a solution of $As_2O_3$ can be employed to deposit at least a partial molecular layer of arsenic, according to the reaction:

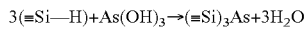

3(≡Si—H)+As(OH)$_3$→(≡Si)$_3$As+3H$_2$O

In a further embodiment of the doping process, wherein the film of dopant material is applied from a dopant composition comprising an organic solution of O=As(OR)3, the film of dopant material applied to the substrate may comprise at least a partial molecular layer of arsenic formed by chemical reaction comprising the following reaction:

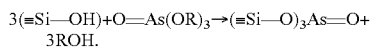

3(≡Si—OH)+O=As(OR)$_3$→(≡Si—O)$_3$As=O+ 3ROH.

In a still further embodiment of the doping process, wherein the film of dopant material is applied from a dopant composition comprising an organic solution of O=As(OR) 3, the film of dopant material applied to the substrate may comprise at least a partial molecular layer of arsenic formed by chemical reaction comprising the following reaction:

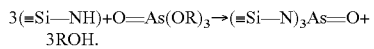

3(≡Si—NH)+O=As(OR)$_3$→(≡Si—N)$_3$As=O+ 3ROH.

In such processes, the chemical reaction may also comprise direct electron exchange with the substrate.

In various embodiments, the disclosure contemplates reaction of the dopant species with the pre-treated silicon surface to effect partial decomposition and covalent bonding of the dopant material to the silicon surface.

Similar reaction processes are contemplated for P, B, and Sb dopants upon interaction with the modified silicon surfaces, as discussed above. Additional variations involving surface treatments and reactive precursor interactions will be apparent to those skilled in the art, based on the disclosure herein.

Additional As may be deposited by direct electron exchange with the Si (or Ge) surface, oxidizing it to slightly soluble silicic (or germanic) acid. The amount deposited can be selectively achieved by varying the temperature, the concentration of $As_2O_3$, and the acidity and chloride concentration, as well as by adding small amounts of HF or hexafluorosilicic (or related) compounds to the solution. The fluoride additive is optionally added in order to dissolve away hydrated Si oxide formed by the redox reaction, and to renew the hydride termination on the surface for further reaction.

As a consequence of its more noble elemental character than silicon, a germanium or germanium tin substrate will not reduce As(3+) to arsine, but it will reduce As(3+) to elemental As.

After the deposition, the substrate is rinsed (e.g., with water and/or IPA), dried, and annealed under conditions effective to facilitate diffusion of As into the substrate. Such conditions are readily determinable within the skill of the art, based on the disclosure herein.

Similar techniques can be used to deposit phosphorus (starting with $H_3PO_3$ or $H_3PO_2$ solutions) or antimony (starting with, e.g., $SbCl_3$ solutions in excess HCl).

A modification of the above-described methodology can be used if a temperature higher than 100° C. is required to achieve deposition of As at a satisfactory rate. Since arsenic trioxide is soluble in glycols, a glycol solution (e.g., using ethylene glycol, propylene glycol, or glycerol) can be used in place of aqueous solution of the dopant compound.

Another aspect of the present disclosure relates to the use of iodides of arsenic, phosphorus, and antimony, as dopant compounds in MLD processes. The bond energies of iodides of arsenic, phosphorus, and antimony are lower than those of bonds of these elements to carbon, and are much lower than those of bonds of such elements to oxygen. Further, such halides are Lewis acids that are readily adsorbed on the relatively electron-rich surfaces of substrates such as Si, Ge, or SiGe. These characteristics enable arsenic, phosphorus, and antimony iodides to be deposited in MLD processes from non-polar aprotic organic solutions, on Si, Ge, or SiGe surfaces, e.g., hydride terminated surfaces of such substrate materials after dilute HF treatment has been carried out.

Such iodide-based MLD processes can be conducted with optional additional surface treatments to enhance interaction with Lewis acid dopant compounds, such as by functionalizing the surface with a mild Lewis base such as an ether group, preferably a mild Lewis base that cannot bind covalently to the halide. This may be accomplished, for example, by conducting a partial reoxidation of the substrate surface and reacting it with an ether-terminated alkyl silane, or by other suitable methods, within the skill of the art based on the present disclosure.

The iodide dopant compounds $AsI_3$, $PI_3$, $P_2I_4$, and $SbI_3$ are all hygroscopic and therefore are advantageously used under an inert, or at least dry, atmosphere. They are soluble in non-polar or slightly polar organic solvents, which may be selected in a given application based on considerations of solvent flash point, dissolution capability, and MLD process compatibility.

Additional embodiments of the present disclosure relate to MLD processes conducted in conventional ALD/CVD equipment using volatile dopant molecules, such as for example an arsenic compound such as $As(Et)_3$, $As(Me)_3$, or $As(NMe_2)_3$, wherein Et is ethyl and Me is methyl. According to this MLD processing technique, the wafer to be doped is placed in a conventional reactor and dosed with the volatile As precursor at appropriate pressure, following which the wafer is capped with $SiO_2$ and rapid thermal processing (RTP) is performed. Such processes are conducted using conventional CVD or ALD reactors, and may be performed in batch furnace mode for high throughput. The vapor phase precursor in such MLD processing technique is selected to react with the substrate surface in a manner analogous to that of MLD wet techniques, to form the desired ultra-shallow junction in the substrate.

While the disclosure has been set forth herein in reference to specific aspects, features and illustrative embodiments, it will be appreciated that the utility of the disclosure is not thus limited, but rather extends to and encompasses numerous other variations, modifications and alternative embodiments, as will suggest themselves to those of ordinary skill in the field of the present disclosure, based on the description herein. Correspondingly, the invention as hereinafter claimed is intended to be broadly construed and interpreted, as including all such variations, modifications and alternative embodiments, within its spirit and scope.

What is claimed is:

1. A doping process, comprising: applying to a substrate a film of dopant material that bonds to the substrate by at least one of hydrogen bonding and covalent bonding; encapsulating the film on the substrate with an encapsulant material, and subjecting the encapsulated film to rapid thermal processing to cause dopant from the dopant material to migrate into the substrate, wherein the film of dopant material is applied from a dopant composition comprising a coordinated moiety that selectively and covalently bonds to the substrate, wherein the dopant composition comprises a compound selected from the group consisting of:

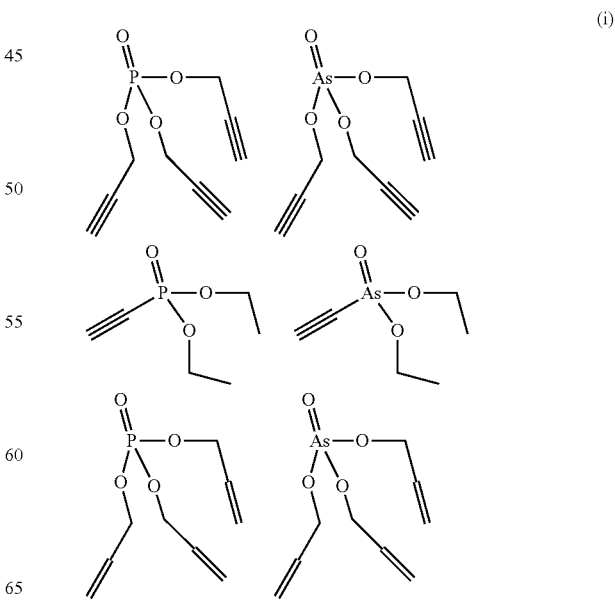

or

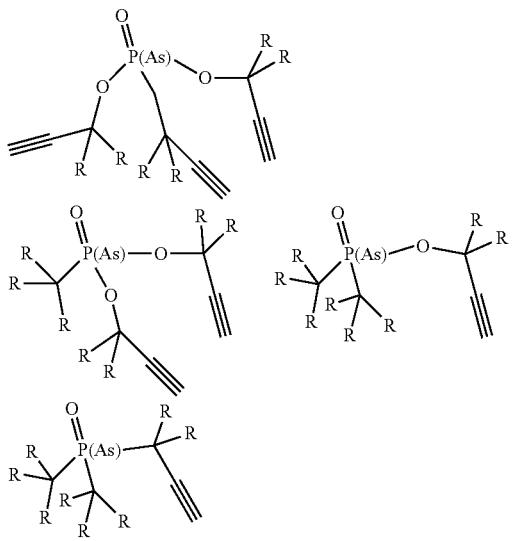

(ii)

wherein P(As) is phosphorous or arsenic, and R is an organo moiety.

2. The process of claim 1, wherein the substrate comprises a silicon substrate, a SiGe substrate, a germanium substrate, or a germanium tin substrate.

3. The process of claim 1, wherein the film comprises a monolayer film.

4. The process of claim 1, wherein the film of dopant material is applied from a dopant composition comprising an aqueous solution comprising an inorganic arsenic compound.

5. The process of claim 4, wherein the inorganic arsenic compound comprises $As_2O_3$.

6. The process of claim 5, wherein the film of dopant material comprises at least a partial molecular layer of arsenic formed by chemical reaction comprising the following reaction, or partial reaction:

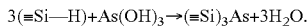

3(≡Si—H)+As(OH)$_3$→(≡Si)$_3$As+3H$_2$O.

7. The process of claim 5, wherein the film of dopant material comprises at least a partial molecular layer of arsenic formed by chemical reaction comprising the following reaction, or partial reaction:

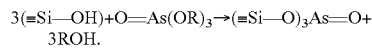

3(≡Si—OH)+O=As(OR)$_3$→(≡Si—O)$_3$As=O+ 3ROH.

8. The process of claim 5, wherein the film of dopant material comprises at least a partial molecular layer of arsenic formed by chemical reaction comprising the following reaction, or partial reaction:

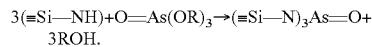

3(≡Si—NH)+O=As(OR)$_3$→(≡Si—N)$_3$As=O+ 3ROH.

9. The process of claim 1, wherein the film of dopant material is applied from a dopant composition comprising an arsenic or phosphorous compound in which ligands or moieties coordinated to an arsenic or phosphorous central atom have coordination bond energies that are lower than those of coordinating bonds of said central atom to oxygen or carbon.

10. The process of claim 1, wherein the dopant composition comprises dodecylphosphonic acid.

11. The process of claim 1, wherein the film of dopant material is applied from a dopant composition comprising a compound that undergoes hydrolysis and alcoholysis to covalently bond a dopant functionality to the substrate in said film of dopant material.

12. The process of claim 11, wherein the compound comprises triethyl arsenate.

13. The process of claim 1, wherein the film of dopant material is applied to the substrate from a liquid solution of dopant precursor.

14. The process of claim 1, wherein the film of dopant material is applied to the substrate from a dopant precursor vapor.

15. The process of claim 1, wherein the film of dopant material is applied from a dopant composition comprising a glycol solution comprising an inorganic arsenic compound.

16. The process of claim 1, wherein the film of dopant material is applied from a dopant composition comprising an aqueous solution comprising an inorganic phosphorus compound.

17. The process of claim 1, wherein the dopant composition comprises precursor vapor of an organodopant compound.

18. The process of claim 17, wherein the organodopant compound comprises an arsenic compound selected from the group consisting of As(Et)$_3$, As(Me)$_3$, and As(NMe$_2$)$_3$, wherein Et is ethyl and Me is methyl.

* * * * *